(12) United States Patent
Haas et al.

(10) Patent No.: US 6,869,320 B2
(45) Date of Patent: Mar. 22, 2005

(54) PORTABLE MODULAR ELECTRONIC SYSTEM WITH SYMMETRICAL CONNECTIONS

(75) Inventors: William R. Haas, Fort Collins, CO (US); Kirk S. Tecu, Greeley, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/422,141

(22) Filed: Apr. 23, 2003

(65) Prior Publication Data

US 2004/0214476 A1 Oct. 28, 2004

(51) Int. Cl.$^7$ ............................................. H01R 13/502
(52) U.S. Cl. ...................................................... 439/701
(58) Field of Search .......................... 455/90, 575, 569; 439/701, 717, 752, 364

(56) References Cited

U.S. PATENT DOCUMENTS 5,913,703 A * 6/1999 Suzuki et al. ............... 439/701
6,341,218 B1 * 1/2002 Poplawsky et al. ......... 455/569.1
2002/0106942 A1 * 8/2002 Sakurai et al. ............... 439/701
2002/0187807 A1 * 12/2002 Torre et al. .................. 455/558

OTHER PUBLICATIONS

"Pen Drive USB Flash Hard Drive", KTI Networks, Inc., www.pendrive.com Oct. 9, 2002.

"QuickSpecs Storage Works by Compaq RAID Array 4100", Compaq Computer Corporation, Jan. 9, 2002.

"Palm (TM) Products", Palm, Inc., www.palm.com. Nov. 1, 2002.

* cited by examiner

Primary Examiner—J. F. Duverne

(57) ABSTRACT

A portable modular electronic system includes a plurality of portable modules in separate respective housings that are mutually attachable and detachable to form the system. Electrical connectors on the modules provide inter-module electrical connections when the modules are attached, and have symmetries that enable multiple different relative orientations between modules.

42 Claims, 4 Drawing Sheets

PORTABLE MODULAR ELECTRONIC SYSTEM WITH SYMMETRICAL CONNECTIONS

BACKGROUND OF THE INVENTION

1. Field of the Invention

This invention relates to electronic systems, and more particularly to portable modular electronic systems with symmetrical connections between modules.

2. Description of the Related Art

Numerous processor-controlled electronic applications (also referred to as "appliances") have been developed, such as portable digital MP3 audio players, digital still or video cameras, digital voice recorders and personal data assistants (PDAs). Some of these applications must be plugged into a personal computer (PC) to operate, while others are stand-alone portable devices. For example, Moving Picture Experts Group Layer 3 Standard (MP3) players are portable with built-in hard drive memories. However, even such portable devices cannot interface with other applications without an intervening PC, and by themselves are limited to a single application.

Portable data storage devices are also available, e.g., a plug-and-play unit that is automatically detected as a removable drive when plugged into a USB (universal serial bus) port on a computer. It can be used to read, write, copy, delete and move data to or from a hard disk drive, and can play MP3 files, run applications or view videos. However, it has a limited storage capacity and, since it must be plugged into a computer, the overall system is not portable.

Some portable handheld computers have a connector at the bottom that enables consumers to snap-on various applications, such as a camera, Global Positioning System (GPS) receiver, bar code scanner, recorder or modem. However, the hand held computers are limited to only a single application at a time, and there is only one way to position an application device relative to the computer.

Controllers associated with a pair of redundant hard drives are also known, such as a RAID (redundant array of industry standard DIMMs (dual in-line memory modules)) system. Again, however, such systems are not portable. When used with a portable application such as an MP3 player, the application must be connected to the controller/memory combination and thus loses its portability.

It is important that any consumer-oriented electronic system be easy to assemble and operate. If the consumer is to be given options in configuring the system for different applications, it is highly desirable that the system have a degree of flexibility in its design so that it can tolerate variations in the way it is assembled by different, non-expert consumers.

SUMMARY OF THE INVENTION

One embodiment of the present invention comprises a portable modular electronic system with a plurality of portable modules in separate respective housings that are mutually attachable and detachable to form the system. Electrical connectors on the modules provide inter-module electrical connections when the modules are attached. The electrical connectors have respective symmetries that establish the inter-module electrical connections for multiple different relative orientations between the modules.

A module in one embodiment comprises a housing, module electronics within the housing, and an electrical connector that is spring-biased to protrude through a wall of the housing to mate with a similar connector of another module when the two modules are mechanically connected together, with the connector electrically connected to the module electronics.

These and other features and advantages of the invention will be apparent to those skilled in the art from the following detailed description, taken together with the accompanying drawings.

DETAILED DESCRIPTION

Embodiments of the present invention provide a portable modular electronic system that enables the consumer to assemble the system with only one application or with a number of different applications, and that tolerates variations in the relative orientations of the modules when they are assembled. It is very easy for the untrained consumer to tailor the system for different applications, without restriction to one particular orientation system. This provides an extra degree of "consumer friendliness", since different untrained people may orient the system's modules in different ways.

Figure 1:
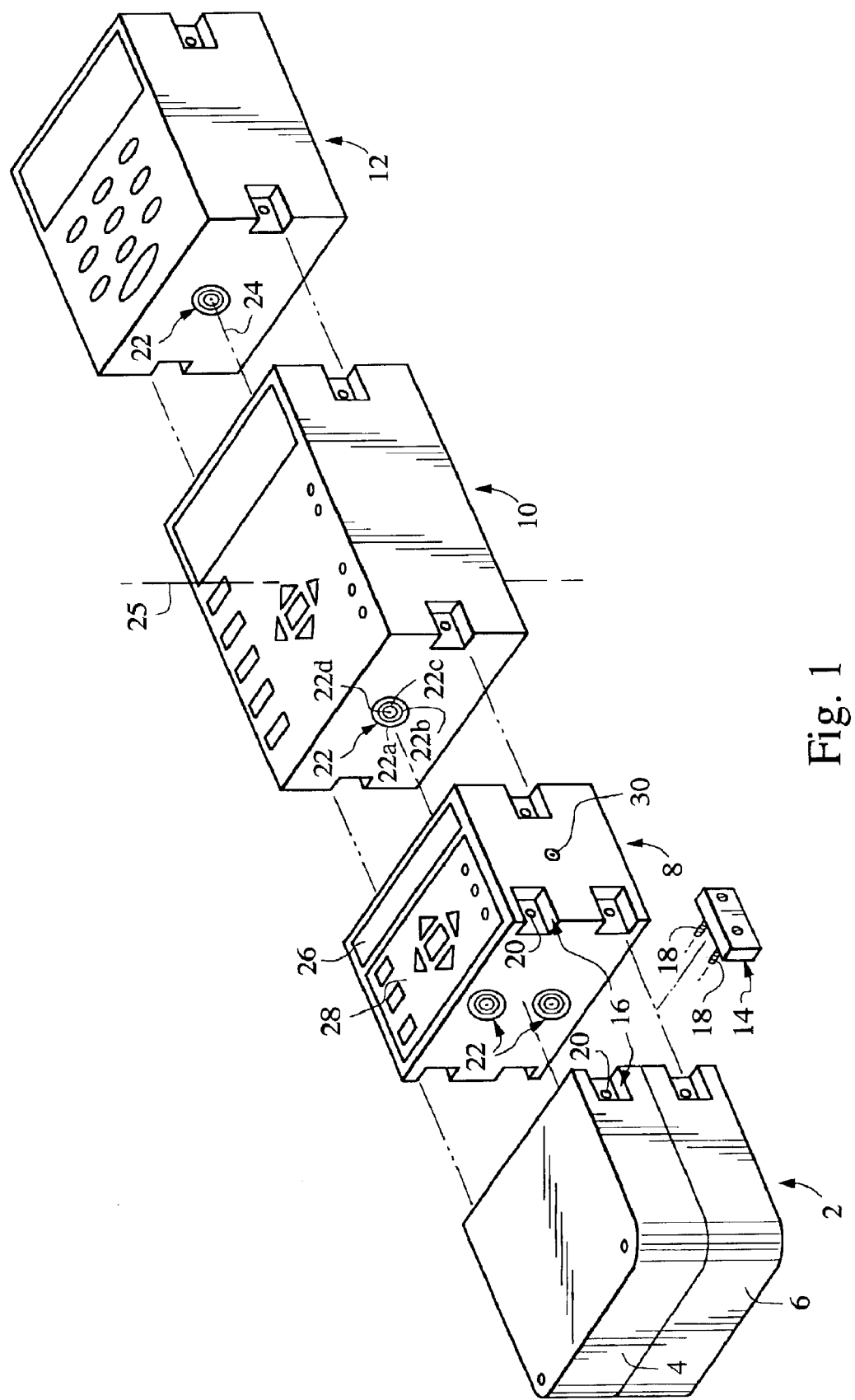
FIGS. 1 and 2 are exploded perspective views of two embodiments of a portable modular electronic system with inter-module electrical connectors in accordance with the invention.

An example of such a system is illustrated in FIG. 1. It consists of a memory module 2 that comprises a pair of independent redundant memories 4 and 6, a controller module 8 and at least one application module, with a pair of application modules 10 and 12 shown in the figure. The controller module 8 controls the flow of data between the memory module 2 and the application modules 10 and 12. The various modules can be connected together into a handheld unified stack by any convenient mechanical connector mechanism, such as links 14 which fit into opposing recesses 16 in adjacent modules and hold the modules together with screws 18 which extend through openings in the links into aligned tapped holes 20 in the modules. Only one link 14 is illustrated in FIG. 1, but additional links or other connector mechanisms would be provided for each opposed pair of module recesses.

Inter-module electrical communication is provided by mutually-aligned electrical connectors 22 on opposing faces of adjacent modules. In the figure, only the electrical connectors on the visible left-side faces of the controller and application modules are shown; additional connectors would be provided on their opposite faces. Since the memory module 2 is designed as an end module in this embodiment, electrical connectors are provided only on its side illustrated as facing the controller module 8. In this example, each independent memory unit 4 and 6 has its own electrical connector, each of which is aligned with a corresponding electrical connector in the controller module 8. Thus, the controller module has a pair of electrical connectors 22 on its left-hand side facing the memory module 2, and a single electrical connector on its right-hand side facing the first application module 10.

The electrical connectors 22 can have a standard USB format, with two power lines and two data lines. The various lines are preferably implemented as three concentric conductive rings 22a, 22b, 22c and a central conductor 22d, which mate with corresponding rings and a central conductor in the electrical connector for the adjacent module when the two modules are brought together. The concentric rings are symmetrical about the axis 24 of the stacked modules, enabling the various modules to be assembled together with any desired individual rotational orientations about the axis without impairing the functionality of the system. The facing pairs of electrical connectors on the memory and controller modules are also symmetrically located on their respective modules, enabling these two modules to be oriented 180° with respect to each other and still retain an alignment between opposing electrical connectors. The portability of the system is enhanced by virtue of the electrical connectors in this embodiment being integral with their respective modules, with electrical connections between adjacent modules not established until the modules are positioned to be mechanically connected together.

This flexible alignment system makes it very easy for the casual consumer to assemble individual modules into an overall portable handheld system. It does not matter whether the various modules face up or down; their electrical connectors will still establish connections with adjacent modules. Universal mechanical connectors would permit the application modules to be oriented at any arbitrary rotational angle about the axis while still retaining the necessary inter-module electrical connections, rather than the 180° orientation enabled by the links 14. Furthermore, the application modules can be rotated 180°, prior to mechanical connection with other modules, about a vertical axis 25, reversing the positions of their left- and right-hand faces shown in FIG. 1. While this would place the electrical connector 22 on the right-hand face of application module 10 in contact with the connector on controller module 8, as explained below the opposed electrical connectors for each application module can be connected together by a common bus that runs through the module to eliminate any electrical difference between the two connectors.

The positions of the application modules 10 and 12 within the stack can also be reversed. When connected together, the electrical connectors 22 and internal buses through each application module form in effect a single common bus for the string of application modules, enabling the controller module 8 to communicate with any desired application module by means of digital codes previously stored in the application and controller modules. Thus, a signal transmitted from the controller module to the application modules would be prefaced with the code of the module for which the signal is intended, so only that module actually processes the signal. Return signals are coded in a similar manner to enable the processor module to identify the application module which originated the signal, and indicate to other modules to refrain from acting on the signal.

The redundant memories 4 and 6 are preferably hard drives, but can also be flash memories or any other portable memory device with desired capacity, protection against movement in a portable system, and compatibility with the controller module. The system could also be implemented with only one memory unit if redundancy is not wanted, or with more than one redundant memory.

The memories provide mass data storage redundancy that enables one memory to take over when the other has failed or become corrupted. They are operated in a conventional master-slave fashion by the controller module, with one memory unit acting as the primary storage and the other as a backup. Since they preferably store the same data, they can be connected to the controller module in either memory position. If one memory unit fails, it is simply disconnected from the system when desired and replaced with a new unit, with the controller module copying the data stored in the remaining memory unit into the new one. The memory units 4, 6 are connected to the controller module 8 by separate sets of links 14 to enable the units' independent replacement.

The controller module 8 typically includes a display 26, and a user interface pad 28 that enables the consumer to enter desired commands. The controller is supplied with a battery compartment to provide power for all the modules in the system through the power buses provided by the electrical connectors 22 and internal module circuitry. A power port 30 can also be provided for an external power source, although in portable use the system would normally operate off its battery(ies).

Any desired number of application modules can be integrated into the stack, with a great degree of flexibility in their orientations as described above. This makes it possible to store data in an easily portable location and have it accessible by multiple applications. Various types of straps, clamps and Various types of straps, clamps and fasteners separate from the electrical connectors can be used for inter-module mechanical connection. An outer housing into which the various modules are placed could also be provided, with an adjustable end plate or the like to hold the modules together with their adjacent electrical connectors in contact with each other. However, this would be more cumbersome and less flexible.

One of the advantages of the system is that it enables connection of multiple application modules that are different not only in their function, but in their dimensions along the system axis 24. The module dimensions in other directions can also be varied. By keeping the connector modules 22 at the centers of their respective faces, the system enables the incorporation of smaller or different shaped modules that may be developed in the future.

The controller data rate is typically greater than that for any single application, making it possible to simultaneously run multiple application modules off the single controller module. The application modules may utilize buffers to store the controller data.

Figure 2:
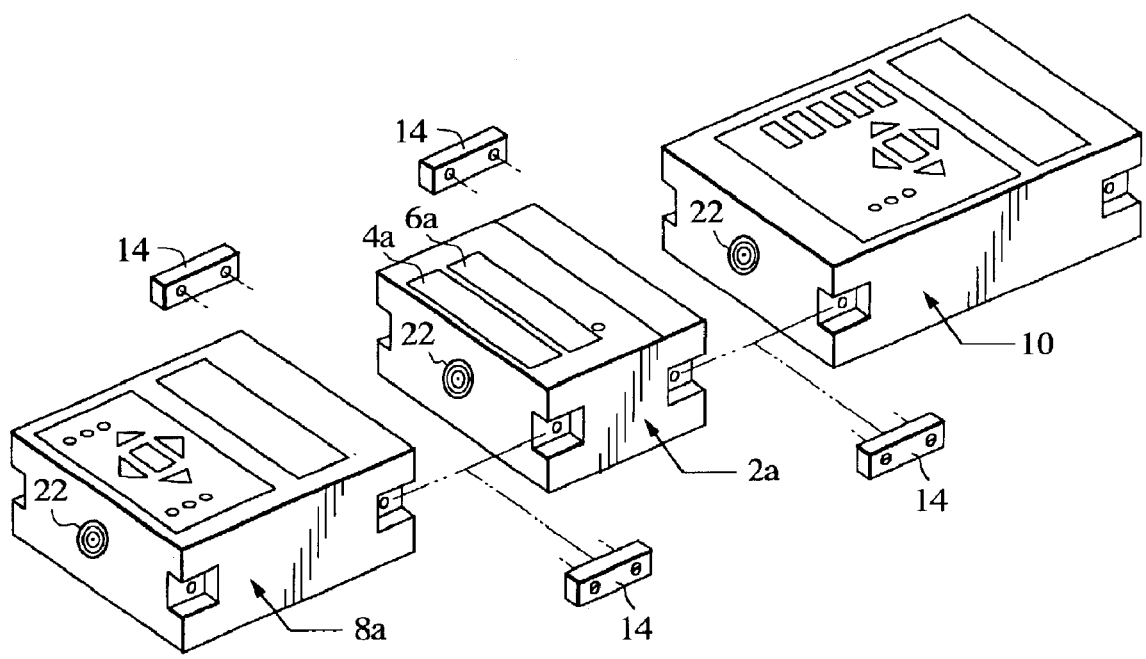

An alternate modular system is illustrated in FIG. 2, with two independent redundant memory units 4a and 6a in a common memory module housing 2a. The two memory units can be independently removed from the housing and replaced. Only a single electrical connector 22 is provided on each face of the housing along the system axis, with each memory unit 4a and 6a connected to the common data and power buses running through the module between its opposed electrical connectors. The controller module 8a distinguishes between the two memory units by means of conventional identification codes associated with each unit.

Since the memory module 2a has only a single electrical connector 22 at each opposite face, it can be placed at any desired location within the stack, rather than being restricted to an end location as shown in FIG. 1. Memory module 2a is instead shown located between the controller module 8a and the application module 10. Since the controller module uses only a single electrical connector to interface with the memory module, the electrical connectors on its opposite faces are also centered on the system axis, enabling the controller module to likewise be positioned at any convenient location within the stack. As shown in FIG. 2, controller module 8*a* is at the end of the stack, with one of its electrical connectors aligned with the memory module 2*a* and the electrical connector on its opposite face exposed. The exposed connector could be covered with a cap if desired, or another application module could be connected to this side of the controller module. Since the controller module communicates with all of the other modules via the common data and power bus running through the connected modules, identifying each different module by its respective identification code, the stack can be assembled with the various modules in any arbitrary position. This makes it very easy for the novice consumer to use. If a particular application module is no longer desired, it can simply be removed from the stack. If it occupies an intermediate position in the stack, it would be disconnected from the modules on either side, removed, and the remaining modules connected back together. New application modules can be added simply by connecting them to either end of the existing stack, or by disconnecting two modules, inserting the new application module in between and reconnecting the modules to the new application module, if desired. Once the controller and memory modules have been connected to the desired application modules, they behave as a single device.

Figure 3:
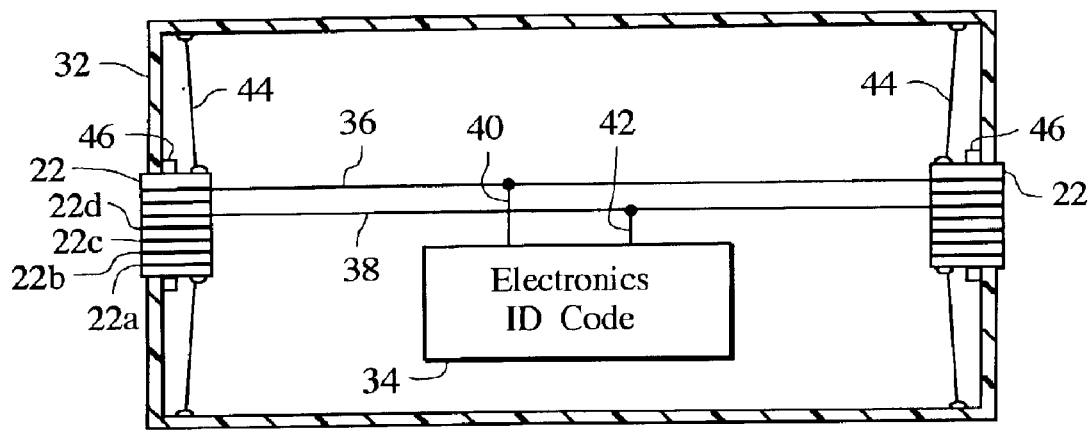
FIG. 3 is a simplified sectional view of an application module with a pair of opposed connector spring biased by flexible resilient webs.

A simplified sectional block view of application module 10 with its electrical connectors is given in FIG. 3. The module includes an outer housing 32, with electrical connectors 22 protruding through openings in opposite walls of the housing, slightly beyond the outer housing surface and generally up to about 1 mm, although this protrusion can be varied. This connector arrangement permits the module to be assembled together with other modules in a linear stack. If for some reason a nonlinear assembly of modules is desired, one or both of the connectors 22 could be placed in different and/or additional walls of a module.

The module's electronic circuitry is indicated generically by block 34. It includes a programmed identification code that distinguishes the module from other application modules. Data and power buses 36 and 38, which can be electrical conductors or optical buses, extend through the interior of the module between corresponding conductive rings and the central conductors of the opposed connectors 22. Two data and two power buses are included in the standard USB configuration, but only one of each is shown for simplicity. The module electronics tap off the data and power buses at taps 40 and 42 to provide power and two-way communication with the memory module, under the control of the controller module and the application module's user interface. The electronics within any other application modules would similarly tap into the data and power buses, which would electrically extend continuously through all of the application modules (and also through the controller and memory modules in the FIG. 2 embodiment).

The connectors 22 can be implemented with plastic or other dielectric plugs into which the conductive rings 22*a*, 22*b*, 22*c* and center conductor 22*d* are set, with the plugs mechanically biased to inactive positions protruding slightly beyond the limits of the module housing 54 by a spring bias. A suitable spring bias is a flexible resilient web 44 attached at its outer periphery to the interior of the housing and at its central area to the connector plug to bias the plug outward, with a stop 46 around the periphery of the plug to limit its travel outward from the housing. When the housing 10 is butted against the housing for an adjacent module, the opposed connector plugs push each other back into their respective modules until their outer faces are substantially flush with the walls through which they protrude, with the spring force of web 44 urging them outward against the mating connector in the other module. A firm electrical contact is thereby established between the two modules.

Figure 4:
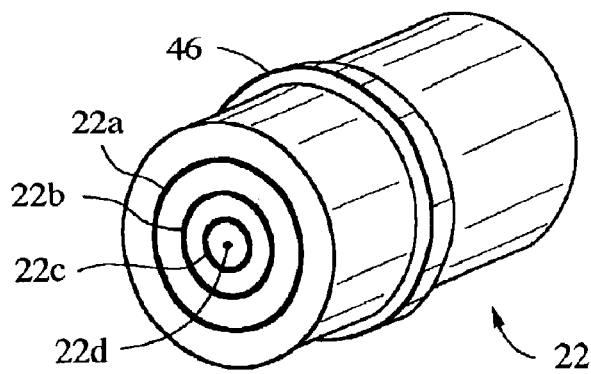
FIG. 4 is a perspective view of one of the connectors shown in FIG. 3.

One embodiment of a connector plug 22 is shown in perspective in FIG. 4. Since the conductive rings 22*a*, 22*b*, 22*c* are circular cylinders, they establish a 360° symmetry that enables adjacent modules to be positioned with any arbitrary rotational angle between them relative to the system axis. While in practice the rectangular cross-section of the module housings in FIGS. 1 and 2 may limit each successive pair of modules to alternate 180° rotational orientations about the system axis, and a square cross-section may limit the inter-module angular orientations to 90° increments, such limitations stem from the housing shape and not from the symmetrical connectors, which are capable of unlimited rotational orientations regardless of housing shape. Giving the housings a circular cross-section would provide an unlimited degree of variation in the relative rotational orientations between modules.

Figure 5:
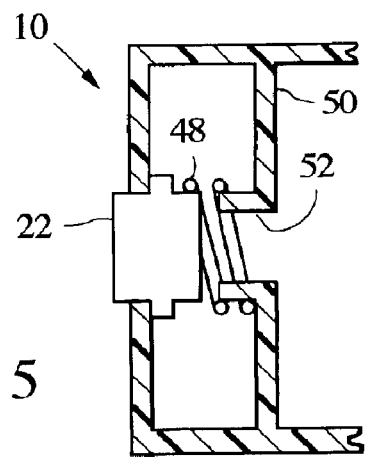
FIG. 5 is a sectional view of one end of a module with a connector plug spring biased by a coil spring.

FIG. 5 illustrates an alternate form of spring bias for the connector plug 22, in which a coil spring 48 is lodged between the stop 46 on the plug and a flange 50 which extends from the wall of housing 10. A central opening 52 through the flange enables for the passage of connector wires or optical signals between the plug and the interior module electronics. Other forms of spring bias, such as a cantilever spring, can also be employed.

Figure 6:
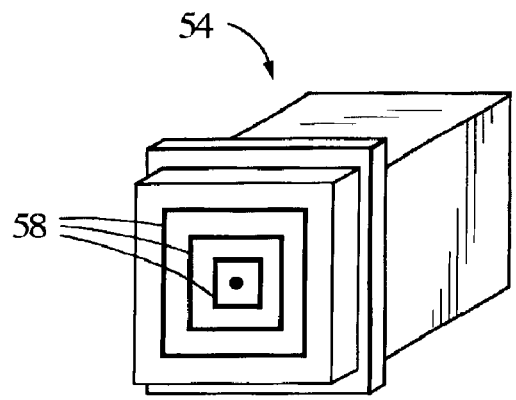
FIGS. 6 and 7 are perspective views of square and oval connector plugs that can be used with the invention.
Figure 7:
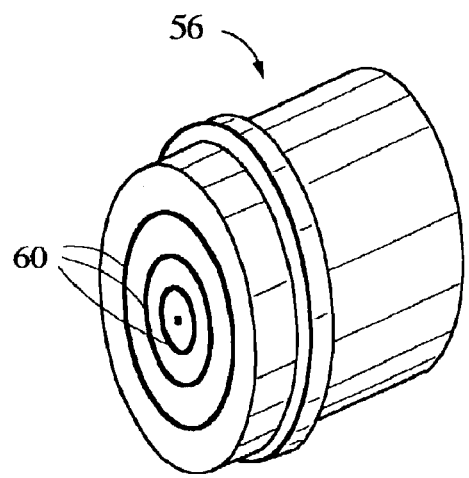

FIGS. 6 and 7 illustrate connector plugs 54 and 56 with square and oval cross-sections, respectively, and corresponding square and oval conductive rings 58 and 60, respectively. As with the circular cross-section plug of FIG. 4, the conductive rings and center conductor are preferably gold-plated. The square configuration of FIG. 6 enables 90° variations in the relative angular orientations between adjacent modules, while the oval plug of FIG. 7 enables 180° variations.

Figure 8:
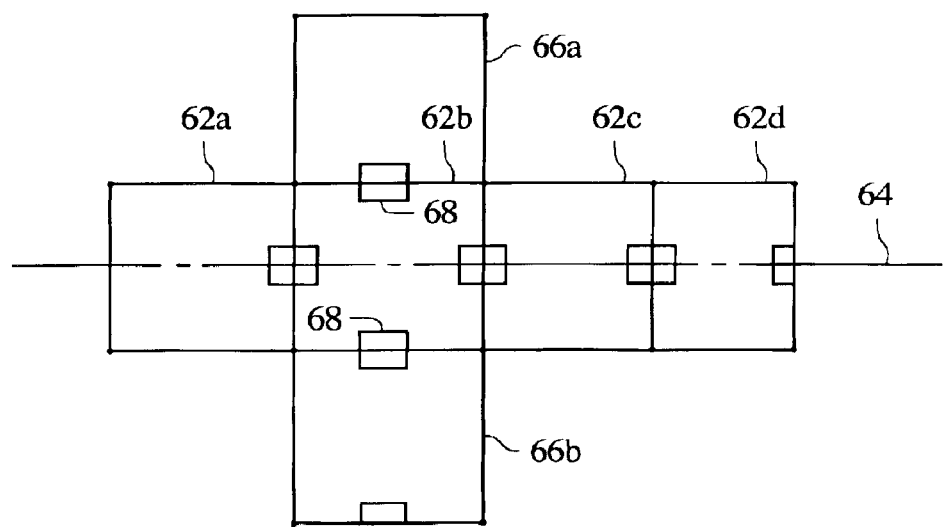
FIG. 8 is a simplified sectional view of a modular electronic system with modules arranged along transverse axes.

FIG. 8 is a simplified view illustrating a variation in which a series of modules 62*a*, 62*b*, 62*c*, 62*d* are coupled together along a major axis 64 as described above, with one or more additional modules 66*a*, 66*b* coupled along a transverse axis to a major axis module 62*b*. For this purpose module 62*b* is provided with additional connectors 68 through housing walls that are parallel to major axis 64. The additional modules can have only a single connector as illustrated for module 66*a*, or multiple connectors as illustrated for module 66*b* to allow for connection with further modules off major axis 64. The system is flexible, and can be designed to accommodate large numbers of modules in many different geometric configurations.

The modular system which has been described enables a flexible number of electronic applications to be integrated into a portable handheld system, without regard to specific orientation. While specific embodiments of the invention have been shown, numerous variations and alternate embodiments will occur to those skilled in the art. For example, other degrees of symmetry between opposed connectors in adjacent modules can be envisioned, as could other mechanisms for establishing symmetrical inter-module connections, such as providing conductive rings directly through the walls of the modules themselves without separate connector plugs. Many different module shapes can be accommodated, and the number of different application modules supported is limited only by the capacities and data rates of the memory and controller modules, and any gross size limitations on the assembled system. Furthermore, a given module could have only one or more than two connectors, some of which could be provided on adjacent walls of the module that are angled to each other. Accordingly, the invention should be limited only in terms of the appended claims.

We claim:

1. A portable modular electronic system, comprising:
    a plurality of portable modules in separate respective housings that are mutually attachable and detachable to form said system, the plurality of modules being attachable in multiple different relative orientations between modules, and
    respective electrical connectors on said modules that provide inter-module electrical connections when said modules are attached, said connectors having corresponding symmetries that establish said inter-module electrical connections for each of said multiple different relative orientations between said modules.

2. The system of claim 1, said modules when attached to each other establishing a system axis, at least some of said connectors being symmetrical about said axis.

3. The system of claim 1, said connectors comprising spring-biased dielectric plugs with mutually spaced conductive rings within said plugs.

4. The system of claim 3, wherein said plugs protrude through openings in their respective modules, with their respective spring-biases positioning them partially beyond the limits of their respective modules when said modules are detached from each other.

5. The system of claim 3, wherein the plugs of adjacent modules are spring-biased against each other to establish said inter-module electrical connections when said modules are detached from each other.

6. The system of claim 3, wherein said plugs are spring-biased by respective flexible resilient webs.

7. The system of claim 3, wherein said plugs are spring-biased by respective coil springs.

8. The system of claim 3, wherein said rings are cylindrical.

9. The system of claim 3, further comprising respective central conductors within said plugs and inside said rings.

10. The system of claim 1, at least some of said modules including said electrical connectors on their opposite sides.

11. The system of claim 10, said modules with electrical connectors on their opposite sides when attached to each other establishing a system axis, the electrical connectors of said at least some modules being centered on said axis.

12. The system of claim 11, at least some of said modules having an electrical connector for connecting to another module transverse to said system axis.

13. The system of claim 1, at least one of said modules including only a single electrical connector.

14. The system of claim 1, said modules comprising controller, memory and at least one application module.

15. A module for a portable modular electronic system, comprising:
    module electronics within a housing, and
    a first electrical connector that is spring-biased to protrude outward through a first wall of said housing to mate with an electrical connector of another module when the two modules are mechanically connected together, said first electrical connector electrically connected to said module electronics and having a symmetry that enables said module to be electrically connected in multiple different module orientations with another module having a similar connector.

16. The module of claim 15, said module having an axis and said first electrical connector being symmetrical about said axis.

17. The module of claim 15, said first connector comprising a dielectric plug with mutually spaced concentric conductive rings within said plug.

18. The module of claim 17, further comprising a central conductor within said plug inside said rings.

19. The module of claim 17, wherein said plug is spring-biased by a flexible resilient web.

20. The module of claim 17, wherein said plug is spring-biased by a coil spring.

21. The module of claim 15, further comprising a second electrical connector that is spring-biased to protrude outwardly though a second wall of said housing to mate with an electrical connector of another module when the two modules are mechanically connected together, said second electrical connector electrically connected to said module electronics.

22. The module of claim 21, said module having an axis, said first and second electrical connectors both being symmetrical about said axis on respective opposed walls of said module.

23. A portable modular electronic system, comprising:
    a plurality of portable modules in separate respective housings that are mutually attachable and detachable to form said system, and
    respective electrical connectors on said modules that provide inter-module electrical connections when said modules are attached, said connectors comprising spring-biased dielectric plugs with mutually spaced conductive rings within said plugs.

24. The system of claim 23, said modules when attached to each other establishing a system axis, at least some of said connectors being symmetrical about said axis.

25. The system of claim 23, wherein said plugs protrude through openings in their respective modules, with their respective spring-biases positioning them partially beyond the limits of their respective modules when said modules are detached from each other.

26. The system of claim 23, wherein the plugs of adjacent modules are spring-biased against each other to establish said inter-module electrical connections when said modules are attached to each other.

27. The system of claim 23, wherein said plugs are spring-biased by respective flexible resilient webs.

28. The system of claim 23, wherein said plugs are spring-biased by respective coil springs.

29. The system of claim 23, wherein said rings are cylindrical.

30. The system of claim 23, further comprising respective central conductors within said plugs and inside said rings.

31. The system of claim 23, at least some of said modules including said electrical connectors on their opposite sides.

32. The system of claim 31, said modules with electrical connectors on their opposite sides when attached to each other establishing a system axis, the electrical connectors of said at least some modules being centered on said axis.

33. The system of claim 32, at least some of said modules having an electrical connector for connecting to another module transverse to said system axis.

34. The system of claim 23, at least one of said modules including only a single electrical connector.

35. The system of claim 23, said modules comprising controller, memory and at least one application module.

36. A module for a portable modular electronic system, comprising:

module electronics within a housing, and a first electrical connector that is biased to protrude outward through a first wall of said housing to mate with an electrical connector of another module, said first electrical connector electrically connected to said module electronics and comprising a dielectric plug with mutually spaced concentric conductive rings within said plug.

37. The module of claim 36, said module having an axis and said first electrical connector being symmetrical about said axis.

38. The module of claim 36, further comprising a central conductor within said plug inside said rings.

39. The module of claim 36, wherein said plug is spring-biased by a flexible resilient web.

40. The module of claim 36, wherein said plug is spring-biased by a coil spring.

41. A module for a portable modular electronic system, comprising:

module electronics within a housing, a first electrical connector that is biased to protrude outward through a first wall of said housing to mate with an electrical connector of another module, said first electrical connector electrically connected to said module electronics, and a second electrical connector that is spring-biased to protrude outwardly through a second wall of said housing to mate with an electrical connector of another module when the two modules are mechanically connected together, said second electrical connector electrically connected to said module electronics.

42. The module of claim 41, said module having an axis, said first and second electrical connectors both being symmetrical about said axis on respective opposed walls of said module.

* * * * *